(12) United States Patent
Chen

(10) Patent No.: US 7,573,972 B2
(45) Date of Patent: Aug. 11, 2009

(54) SWITCH SET OF BI-DIRECTIONAL SHIFT REGISTER MODULE

(75) Inventor: Chung-Chun Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/061,649

(22) Filed: Apr. 3, 2008

(65) Prior Publication Data

US 2009/0129535 A1 May 21, 2009

(30) Foreign Application Priority Data

Nov. 16, 2007 (TW) .............................. 96143524 A

(51) Int. Cl.
*G11C 19/00* (2006.01)
(52) U.S. Cl. .......................................... 377/64; 377/69
(58) Field of Classification Search ....................... None
See application file for complete search history.

(56) References Cited

U.S. PATENT DOCUMENTS

| 5,282,234 | A | * | 1/1994 | Murayama et al. ............ 377/69 |
| 5,717,351 | A | | 2/1998 | Katsutani |
| 5,859,630 | A | | 1/1999 | Huq |
| 6,778,626 | B2 | | 8/2004 | Yu |
| 7,366,274 | B2 | * | 4/2008 | Tseng et al. ................... 377/64 |
| 2003/0193465 | A1 | * | 10/2003 | Ohkawa et al. ............. 345/100 |
| 2005/0084059 | A1 | * | 4/2005 | Yu ............................... 377/34 |
| 2006/0159217 | A1 | * | 7/2006 | Harada ........................ 377/64 |

* cited by examiner

*Primary Examiner*—Tuan Lam
(74) *Attorney, Agent, or Firm*—Winston Hsu

(57) ABSTRACT

A switch set used in a bi-directional shift register circuit includes a plurality of switch devices. Each switch device is controlled by corresponding control signals to switch the direction of the input signal. One of the switch devices includes a first switch unit for transmitting a shift register signal from a previous shift register to a shift register according to a first control signal, a second switch unit for transmitting a shift register signal from a next shift register to the shift register according to a second control signal. The first and the second control signals have the same frequency as the clock signal of the shift register circuit.

8 Claims, 6 Drawing Sheets

SWITCH SET OF BI-DIRECTIONAL SHIFT REGISTER MODULE

BACKGROUND OF THE INVENTION

1. Field of the Invention

The present invention relates to a switch set of bi-directional shift register modules, and more particularly, to a switch set of bi-directional shift register modules controlled by clock signals.

2. Description of the Prior Art

FIG. 1 is a diagram illustrating a conventional bi-directional shift register circuit 100. The bi-directional shift register circuit 100 comprises shift register module 110 and switch set 120. The shift register module 110 comprises shift registers $SR_1$, $SR_2$, and $SR_3$. The switch set 120 comprises switch devices $SW_1$, $SW_2$, and $SW_3$. Each of the shift registers $SR_1 \sim SR_3$ is a one-to-one shift register. That is, each shift register only receives signal outputted from either the previous shift register or the next shift register as input signal. For example, the shift register $SR_2$ receives either the shift register signal $SRO_1$ from the shift register $SR_1$ or the shift register signal $SRO_3$ from the shift register $SR_3$. Each of the shift registers $SR_1 \sim SR_3$ comprises a first input end $I_5$, a second input end $I_6$, and a third input end $I_7$. The first input end $I_5$ receives a shift register signal, the second input end $I_6$ (clock input end) receives a clock signal, and the third input end $I_7$ (clock input end) receives an inversed clock signal of the clock signal. Each of the shift registers $SR_1 \sim SR_3$ samples the received shift register signal and output shift register signal according to the clock signal and the inversed clock signal. The shift register module 110 controls the direction of the transmission of the shift register signals of the shift registers $SR_1 \sim SR_3$ by adjusting clock signal CLK and XCLK. The clock signal XCLK is the inversed clock signal of the clock signal CLK. For example, when the shift register module 110 set to transmit shift register signals in a first direction (the forward direction), each second input end $I_6$ of the shift registers $SR_1 \sim SR_3$ is input with the clock signal CLK, and each third input end $I_7$ of the shift registers $SR_1 \sim SR_3$ is input with the clock signal XCLK. In this way, the shift register module 110 transmits shift register signals in the first direction. When the shift register module 110 is set to transmit shift register signals in the reverse direction of the forward direction, each second input end $I_6$ of the shift registers $SR_1 \sim SR_3$ is input with the clock signal XCLK, and each third input end $I_7$ of the shift registers $SR_1 \sim SR_3$ is input with the clock signal CLK. In this way, the shift register module 110 transmits shift register signals in the reverse of the first direction.

As shown in FIG. 1, the switch device $SW_1$ controls the input signal $SRI_1$ of the shift register $SR_1$. The switch device $SW_1$ comprises three control ends $C_1$, $C_2$, and $C_3$, two input ends $I_1$, and $I_2$, two output ends $O_1$, and $O_2$, and two switch units $CM_{11}$ and $CM_{12}$. The control end $C_1$ of the switch device $SW_1$ receives the control signal VBD, the control end $C_2$ of the switch device $SW_1$ receives the control signal XBD, and the control end $C_3$ of the switch device $SW_1$ receives the control signal VBD. The input end $I_1$ of the switch device $SW_1$ receives a start signal ST, the input end $I_2$ of the switch device $SW_1$ is coupled to the output end $O_3$ of the shift register $SR_2$ for receiving the shift register signal $SRO_2$. The output ends $O_1$ and $O_2$ of the switch device $SW_1$ are both coupled to the input end $I_5$ of the shift register $SR_1$ for transmitting the input signal $SRI_1$ to the shift register $SR_1$. The switch units $CM_{11}$ and $CM_{12}$ can be realized with any components having switch functions, for example, Complementary Metal Oxide Semiconductor (CMOS). The CMOS transistor comprises two switch units. One of the switch units of the CMOS transistor is realized with N-type Metal Oxide Semiconductor (NMOS) and the other one of the switch units of the CMOS is realized with P-type Metal Oxide Semiconductor (PMOS). As shown in FIG. 1, the first end of the PMOS of the switch unit $CM_{11}$ is coupled to the input end $I_1$, the second end of the PMOS of the switch unit $CM_{11}$ is coupled to the output end $O_1$, and the control end of the PMOS of the switch unit $CM_{11}$ is coupled to the control end $C_1$. The first end of the NMOS of the switch unit $CM_{11}$ is coupled to the input end $I_1$, the second end of the NMOS of the switch unit $CM_{11}$ is coupled to the output end $O_1$, and the control end of the NMOS of the switch unit $CM_{11}$ is coupled to the control end $C_2$. The first end of the PMOS of the switch unit $CM_{12}$ is coupled to the input end $I_2$, the second end of the PMOS of the switch unit $CM_{12}$ is coupled to the output end $O_2$, and the control end of the PMOS of the switch unit $CM_{12}$ is coupled to the control end $C_2$. The first end of the NMOS of the switch unit $CM_{12}$ is coupled to the input end $I_2$, the second end of the NMOS of the switch unit $CM_{12}$ is coupled to the output end $O_2$, and the control end of the NMOS of the switch unit $CM_{12}$ is coupled to the control end $C_3$.

The switch device $SW_2$ controls the input signal $SRI_2$ of the shift register $SR_2$. The switch device $SW_2$ comprises three control ends $C_1$, $C_2$, and $C_3$, two input ends $I_1$, and $I_2$, two output ends $O_1$, and $O_2$, and two switch units $CM_{21}$ and $CM_{22}$. The control end $C_1$ of the switch device $SW_2$ receives the control signal VBD, the control end $C_2$ of the switch device $SW_2$ receives the control signal XBD, and the control end $C_3$ of the switch device $SW_2$ receives the control signal VBD. The input end $I_1$ of the switch device $SW_2$ is coupled to the output end $O_3$ of the shift register $SR_1$ for receiving the shift register signal $SRO_1$, the input end $I_2$ of the switch device $SW_2$ is coupled to the output end $O_3$ of the shift register $SR_3$ for receiving the shift register signal $SRO_3$. The output ends $O_1$ and $O_2$ of the switch device $SW_2$ are both coupled to the input end $I_5$ of the shift register $SR_2$ for transmitting the input signal $SRI_2$ to the shift register $SR_2$. The switch units $CM_{21}$ and $CM_{22}$ can be realized with any components having switch functions, for example, CMOS. The CMOS transistor comprises two switch units. One of the switch units of the CMOS transistor is realized with NMOS and the other one of the switch units of the CMOS transistor is realized with PMOS. As shown in FIG. 1, the first end of the PMOS of the switch unit $CM_{21}$ is coupled to the input end $I_1$, the second end of the PMOS of the switch unit $CM_{21}$ is coupled to the output end $O_1$, and the control end of the PMOS of the switch unit $CM_{21}$ is coupled to the control end $C_1$. The first end of the NMOS of the switch unit $CM_{21}$ is coupled to the input end $I_1$, the second end of the NMOS of the switch unit $CM_{21}$ is coupled to the output end $O_1$, and the control end of the NMOS of the switch unit $CM_{21}$ is coupled to the control end $C_2$. The first end of the PMOS of the switch unit $CM_{22}$ is coupled to the input end $I_2$, the second end of the PMOS of the switch unit $CM_{22}$ is coupled to the output end $O_2$, and the control end of the PMOS of the switch unit $CM_{22}$ is coupled to the control end $C_2$. The first end of the NMOS of the switch unit $CM_{22}$ is coupled to the input end $I_2$, the second end of the NMOS of the switch unit $CM_{22}$ is coupled to the output end $O_2$, and the control end of the NMOS of the switch unit $CM_{22}$ is coupled to the control end $C_3$.

The switch device $SW_3$ controls the input signal SRI3 of the shift register $SR_3$. The switch device $SW_3$ comprises three control ends $C_1$, $C_2$, and $C_3$, two input ends $I_1$, and $I_2$, two output ends $O_1$, and $O_2$, and two switch units $CM_{31}$ and $CM_{32}$. The control end $C_1$ of the switch device $SW_3$ receives the control signal VBD, the control end $C_2$ of the switch device $SW_3$ receives the control signal XBD, and the control end $C_3$ of the switch device $SW_3$ receives the control signal VBD. The input end $I_1$ of the switch device $SW_3$ is coupled to the output end $O_3$ of the shift register $SR_2$ for receiving the shift register signal $SRO_2$, the input end $I_2$ of the switch device $SW_3$ receives the start signal ST. The output ends $O_1$ and $O_2$ of the switch device $SW_3$ are both coupled to the input end $I_5$ of the shift register $SR_3$ for transmitting the input signal $SRI_3$ to the shift register $SR_3$. The switch units $CM_{31}$ and $CM_{32}$ can be realized with any components having switch functions, for example, CMOS. The CMOS transistor comprises two switch units. One of the switch units of the CMOS transistor is realized with NMOS and the other one of the switch units of the CMOS transistor is realized with PMOS. As shown in FIG. 1, the first end of the PMOS of the switch unit $CM_{31}$ is coupled to the input end $I_1$, the second end of the PMOS of the switch unit $CM_{31}$ is coupled to the output end $O_1$, and the control end of the PMOS of the switch unit $CM_{31}$ is coupled to the control end $C_1$. The first end of the NMOS of the switch unit $CM_{31}$ is coupled to the input end $I_1$, the second end of the NMOS of the switch unit $CM_{31}$ is coupled to the output end $O_1$, and the control end of the NMOS of the switch unit $CM_{31}$ is coupled to the control end $C_2$. The first end of the PMOS of the switch unit $CM_{32}$ is coupled to the input end $I_2$, the second end of the PMOS of the switch unit $CM_{32}$ is coupled to the output end $O_2$, and the control end of the PMOS of the switch unit $CM_{32}$ is coupled to the control end $C_2$. The first end of the NMOS of the switch unit $CM_{32}$ is coupled to the input end $I_2$, the second end of the NMOS of the switch unit $CM_{32}$ is coupled to the output end $O_2$, and the control end of the NMOS of the switch unit $CM_{32}$ is coupled to the control end $C_3$.

When the shift register circuit 100 is set to operate in the forward direction, the control signal VBD of the switch set 120 is set at a first predetermined voltage (for example, high voltage), and the control signal XBD of the switch set 120 is set a second predetermined voltage (for example, low voltage). In this way, the switch unit $CM_{11}$ of the switch device $SW_1$ is turned on, the switch unit $CM_{12}$ of the switch device $SW_1$ is turned off, and consequently the start signal ST is transmitted to the input end $I_5$ of the shift register $SR_1$ as the input signal $SRI_1$. The switch unit $CM_{21}$ of the switch device $SW_2$ is turned on, the switch unit $CM_{22}$ of the switch device $SW_2$ is turned off, and consequently the shift register signal $SRO_1$ is transmitted to the input end $I_5$ of the shift register $SR_2$ as the input signal $SRI_2$. The switch unit $CM_{31}$ of the switch device $SW_3$ is turned on, the switch unit $CM_{32}$ of the switch device $SW_3$ is turned off, and consequently the shift register signal $SRO_2$ is transmitted to the input end $I_5$ of the shift register $SR_3$ as the input signal $SRI_3$.

On the other hand, when the shift register circuit 100 is set to operate in the reverse direction, the control signal VBD of the switch set 120 is set at the second predetermined voltage, and the control signal XBD of the switch set 120 is set at the first predetermined voltage. In this way, the switch unit $CM_{12}$ of the switch device $SW_1$ is turned on, the switch unit $CM_{11}$ of the switch device $SW_1$ is turned off, and consequently the shift register signal $SRO_2$ is transmitted to the input end $I_5$ of the shift register $SR_1$ as the input signal $SRI_1$. The switch unit $CM_{22}$ of the switch device $SW_2$ is turned on, the switch unit $CM_{21}$ of the switch device $SW_2$ is turned off, and consequently the shift register signal $SRO_3$ is transmitted to the input end $I_5$ of the shift register $SR_2$ as the input signal $SRI_2$. The switch unit $CM_{32}$ of the switch device $SW_3$ is turned on, the switch unit $CM_{31}$ of the switch device $SW_3$ is turned off, and consequently the start signal ST is transmitted to the input end $I_5$ of the shift register $SR_3$ as the input signal $SRI_3$.

The drawback of the conventional switch set 120 is that the control signals VBD and XBD have to respectively keep at the first predetermined voltage and the second predetermined voltage when the shift register circuit 100 is set to operate in the forward direction, and the control signals VBD and XBD have to respectively keep at the second predetermined voltage and the first predetermined voltage when the shift register circuit 100 is set to operate in the reverse direction. Due to the control signals VBD and XBD have to keep at a fixed predetermined voltage for long time, consequently, the stay of the control signals VBD and XBD causes aging of the switch components, which reduce the lifetime of the switch components, especially when the switch components are amorphous silicon (a-Si) thin film transistor (TFT).

FIG. 2 is a diagram illustrating another conventional bi-directional shift register circuit 200. The bi-directional shift register circuit 200 comprises shift register module 210 and switch set 220. The shift register module 210 comprises shift registers $SR_1$, $SR_2$, and $SR_3$. The switch set 220 comprises switch devices $SW_{11}$, $SW_{12}$, $SW_{21}$, $SW_{22}$, $SW_{31}$, and $SW_{32}$. Each of the shift registers $SR_1$~$SR_3$ is a two-to-one shift register. That is, each shift register receives signals outputted both from the previous shift register and the next shift register as input signals. For example, the shift register $SR_2$ receives both of the shift register signal $SRO_1$ from the shift register $SR_1$ and the shift register signal $SRO_3$ from the shift register $SR_3$. Each of the shift registers $SR_1$~$SR_3$ comprises a first input end $I_5$, a second input end $I_6$, a third input end $I_7$, and a fourth input end $I_8$. The first input end $I_5$ receives a shift register signal, the second input end $I_6$ (clock input end) receives a clock signal, the third input end $I_7$ (clock input end) receives the inversed clock signal of the clock signal, and the fourth input end $I_8$ receives another shift register signal. Each of the shift registers $SR_1$~$SR_3$ samples the received shift register signals and is triggered to output shift register signals according to the clock signal and the inversed clock signal of the clock signal. The shift register module 210 controls the direction of the transmission of the shift register signals of the shift registers $SR_1$~$SR_3$ by adjusting clock signal CLK and XCLK. The clock signal XCLK is the inversed clock signal of the clock signal CLK. For example, when the shift register module 110 is set to transmit shift register signals in the forward direction, each second input end I6 of the shift registers $SR_1$~$SR_3$ is input with the clock signal CLK, and each third input end $I_7$ of the shift registers $SR_1$~$SR_3$ is input with the clock signal XCLK. In this way, the shift register module 210 transmits shift register signals in the forward direction. When the shift register module 210 is set to transmit shift register signals in the reverse direction, each second input end $I_6$ of the shift registers $SR_1$~$SR_3$ is input with the clock signal XCLK, and each third input end $I_7$ of the shift registers $SR_1$~$SR_3$ is input with the clock signal CLK. In this way, the shift register module 210 transmits shift register signals in the reverse direction.

As shown in FIG. 2, the switch device $SW_{11}$ controls the input signal $SRI_{11}$ of the shift register $SR_1$. The switch device $SW_{12}$ controls the input signal $SRI_{12}$ of the shift register $SR_1$. The switch device $SW_{11}$ comprises three control ends $C_1$, $C_2$, and $C_3$, two input ends $I_1$, and $I_2$, two output ends $O_1$, and $O_2$, and two switch units $CM_{11}$ and $CM_{12}$. The control end $C_1$ of the switch device $SW_{11}$ receives the control signal VBD, the control end $C_2$ of the switch device $SW_{11}$ receives the control signal XBD, and the control end $C_3$ of the switch device $SW_{11}$ receives the control signal VBD. The input end $I_1$ of the switch device $SW_{11}$ receives the start signal ST, the input end $I_2$ of the switch device $SW_{11}$ is coupled to the output end $O_3$ of the shift register $SR_2$ for receiving the shift register signal $SRO_2$. The output ends $O_1$ and $O_2$ of the switch device $SW_{11}$ are both coupled to the first input end $I_5$ of the shift register $SR_1$ for transmitting signals to the shift register $SR_1$ as the input signals $SRI_{11}$. The switch units $CM_{11}$ and $CM_{12}$ can be realized with any components having switch functions, for example, CMOS. The CMOS transistor comprises two switches. One of the switches of the CMOS transistor is realized with NMOS and the other one of the switches of the CMOS is realized with PMOS. As shown in FIG. 2, the first end of the PMOS of the switch unit $CM_{11}$ is coupled to the input end $I_1$, the second end of the PMOS of the switch unit $CM_{11}$ is coupled to the output end $O_1$, and the control end of the PMOS of the switch unit $CM_{11}$ is coupled to the control end $C_1$. The first end of the NMOS of the switch unit $CM_{11}$ is coupled to the input end $I_1$, the second end of the NMOS of the switch unit $CM_{11}$ is coupled to the output end $O_1$, and the control end of the NMOS of the switch unit $CM_{11}$ is coupled to the control end $C_2$. The first end of the PMOS of the switch unit $CM_{12}$ is coupled to the input end $I_2$, the second end of the PMOS of the switch unit $CM_{12}$ is coupled to the output end $O_2$, and the control end of the PMOS of the switch unit $CM_{12}$ is coupled to the control end $C_2$. The first end of the NMOS of the switch unit $CM_{12}$ is coupled to the input end $I_2$, the second end of the NMOS of the switch unit $CM_{12}$ is coupled to the output end $O_2$, and the control end of the NMOS of the switch unit $CM_{12}$ is coupled to the control end $C_3$.

The switch device $SW_{12}$ comprises three control ends $C_1$, $C_2$, and $C_3$, two input ends $I_1$, and $I_2$, two output ends $O_1$, and $O_2$, and two switch units $CM_{13}$ and $CM_{14}$. The control end $C_1$ of the switch $SW_{12}$ receives the control signal XBD, the control end $C_2$ of the switch $SW_{12}$ receives the control signal VBD, and the control end $C_3$ of the switch $SW_{12}$ receives the control signal XBD. The input end $I_1$ of the switch device $SW_{12}$ receives the start signal ST, the input end $I_2$ of the switch device $SW_{12}$ is coupled to the output end $O_3$ of the shift register $SR_2$ for receiving the shift register signal $SRO_2$. The output ends $O_1$ and $O_2$ of the switch device $SW_{12}$ are both coupled to the second input end $I_8$ of the shift register $SR_1$ for transmitting signals to the shift register $SR_2$ as the input signal $SRI_{12}$. The switch units $CM_{13}$ and $CM_{14}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 2, the first end of the PMOS of the switch unit $CM_{13}$ is coupled to the input end $I_1$, the second end of the PMOS of the switch unit $CM_{13}$ is coupled to the output end $O_1$, and the control end of the PMOS of the switch unit $CM_{13}$ is coupled to the control end $C_1$. The first end of the NMOS of the switch unit $CM_{13}$ is coupled to the input end $I_1$, the second end of the NMOS of the switch unit $CM_{13}$ is coupled to the output end $O_1$, and the control end of the NMOS of the switch unit $CM_{13}$ is coupled to the control end $C_2$. The first end of the PMOS of the switch unit $CM_{14}$ is coupled to the input end $I_2$, the second end of the PMOS of the switch unit $CM_{14}$ is coupled to the output end $O_2$, and the control end of the PMOS of the switch unit $CM_{14}$ is coupled to the control end $C_2$. The first end of the NMOS of the switch unit $CM_{14}$ is coupled to the input end $I_2$, the second end of the NMOS of the switch unit $CM_{14}$ is coupled to the output end $O_2$, and the control end of the NMOS of the switch unit $CM_{14}$ is coupled to the control end $C_3$.

The switch device $SW_{21}$ controls the input signal $SRI_{21}$ of the shift register $SR_2$. The switch device $SW_{22}$ controls the input signal $SRI_{22}$ of the shift register $SR_2$. The switch device $SW_{21}$ comprises three control ends $C_1$, $C_2$, and $C_3$, two input ends $I_1$, and $I_2$, two output ends $O_1$, and $O_2$, and two switch units $CM_{21}$ and $CM_{22}$. The control end $C_1$ of the switch device $SW_{21}$ receives the control signal VBD, the control end $C_2$ of the switch device $SW_{21}$ receives the control signal XBD, and the control end $C_3$ of the switch device $SW_{21}$ receives the control signal VBD. The input end $I_1$ of the switch device $SW_{21}$ is coupled to the output end $O_3$ of the shift register $SR_1$ for receiving the shift register signal $SRO_1$, the input end $I_2$ of the switch device $SW_{21}$ is coupled to the output end $O_3$ of the shift register $SR_3$ for receiving the shift register signal $SRO_3$. The output ends $O_1$ and $O_2$ of the switch device $SW_{21}$ are both coupled to the first input end $I_5$ of the shift register $SR_2$ for transmitting signals to the shift register $SR_2$ as the input signals $SRI_{21}$. The switch units $CM_{21}$ and $CM_{22}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 2, the first end of the PMOS of the switch unit $CM_{21}$ is coupled to the input end $I_1$, the second end of the PMOS of the switch unit $CM_{21}$ is coupled to the output end $O_1$, and the control end of the PMOS of the switch unit $CM_{21}$ is coupled to the control end $C_1$. The first end of the NMOS of the switch unit $CM_{21}$ is coupled to the input end $I_1$, the second end of the NMOS of the switch unit $CM_{21}$ is coupled to the output end $O_1$, and the control end of the NMOS of the switch unit $CM_{21}$ is coupled to the control end $C_2$. The first end of the PMOS of the switch unit $CM_{22}$ is coupled to the input end $I_2$, the second end of the PMOS of the switch unit $CM_{22}$ is coupled to the output end $O_2$, and the control end of the PMOS of the switch unit $CM_{22}$ is coupled to the control end $C_2$. The first end of the NMOS of the switch unit $CM_{22}$ is coupled to the input end $I_2$, the second end of the NMOS of the switch unit $CM_{22}$ is coupled to the output end $O_2$, and the control end of the NMOS of the switch unit $CM_{22}$ is coupled to the control end $C_3$.

The switch device $SW_{22}$ comprises three control ends $C_1$, $C_2$, and $C_3$, two input ends $I_1$, and $I_2$, two output ends $O_1$, and $O_2$, and two switch units $CM_{23}$ and $CM_{24}$. The control end $C_1$ of the switch $SW_{22}$ receives the control signal XBD, the control end $C_2$ of the switch $SW_{22}$ receives the control signal VBD, and the control end $C_3$ of the switch $SW_{22}$ receives the control signal XBD. The input end $I_1$ of the switch device $SW_{22}$ is coupled to the output end $O_3$ of the shift register $SR_1$ for receiving the shift register signal $SRO_1$, the input end $I_2$ of the switch device $SW_{22}$ is coupled to the output end $O_3$ of the shift register $SR_3$ for receiving the shift register signal $SRO_3$. The output ends $O_1$ and $O_2$ of the switch device $SW_{22}$ are both coupled to the second input end $I_8$ of the shift register $SR_2$ for transmitting signals to the shift register $SR_2$ as the input signal $SRI_{12}$. The switch units $CM_{23}$ and $CM_{24}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 2, the first end of the PMOS of the switch unit $CM_{23}$ is coupled to the input end $I_1$, the second end of the PMOS of the switch unit $CM_{23}$ is coupled to the output end $O_1$, and the control end of the PMOS of the switch unit $CM_{23}$ is coupled to the control end $C_1$. The first end of the NMOS of the switch unit $CM_{23}$ is coupled to the input end $I_1$, the second end of the NMOS of the switch unit $CM_{23}$ is coupled to the output end $O_1$, and the control end of the NMOS of the switch unit $CM_{23}$ is coupled to the control end $C_2$. The first end of the PMOS of the switch unit $CM_{24}$ is coupled to the input end $I_2$, the second end of the PMOS of the switch unit $CM_{24}$ is coupled to the output end $O_2$, and the control end of the PMOS of the switch unit $CM_{24}$ is coupled to the control end $C_2$. The first end of the NMOS of the switch unit $CM_{24}$ is coupled to the input end $I_2$, the second end of the NMOS of the switch unit $CM_{24}$ is coupled to the output end $O_2$, and the control end of the NMOS of the switch unit $CM_{24}$ is coupled to the control end $C_3$.

The switch device $SW_{31}$ controls the input signal $SRI_{31}$ of the shift register $SR_3$. The switch device $SW_{32}$ controls the input signal $SRI_{32}$ of the shift register $SR_3$. The switch device $SW_{31}$ comprises three control ends $C_1$, $C_2$, and $C_3$, two input ends $I_1$, and $I_2$, two output ends $O_1$, and $O_2$, and two switch units $CM_{31}$ and $CM_{32}$. The control end $C_1$ of the switch device $SW_{31}$ receives the control signal VBD, the control end $C_2$ of the switch device $SW_{31}$ receives the control signal XBD, and the control end $C_3$ of the switch device $SW_{31}$ receives the control signal VBD. The input end $I_1$ of the switch device $SW_{31}$ is coupled to the output end $O_3$ of the shift register $SR_2$ for receiving the shift register signal $SRO_2$, the input end $I_2$ of the switch device $SW_{31}$ receives the start signal ST. The output ends $O_1$ and $O_2$ of the switch device $SW_{31}$ are both coupled to the first input end $I_5$ of the shift register $SR_3$ for transmitting signals to the shift register $SR_3$ as the input signals $SRI_{31}$. The switch units $CM_{31}$ and $CM_{32}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 2, the first end of the PMOS of the switch unit $CM_{31}$ is coupled to the input end $I_1$, the second end of the PMOS of the switch unit $CM_{31}$ is coupled to the output end $O_1$, and the control end of the PMOS of the switch unit $CM_{31}$ is coupled to the control end $C_1$. The first end of the NMOS of the switch unit $CM_{31}$ is coupled to the input end $I_1$, the second end of the NMOS of the switch unit $CM_{31}$ is coupled to the output end $O_1$, and the control end of the NMOS of the switch unit $CM_{31}$ is coupled to the control end $C_2$. The first end of the PMOS of the switch unit $CM_{32}$ is coupled to the input end $I_2$, the second end of the PMOS of the switch unit $CM_{32}$ is coupled to the output end $O_2$, and the control end of the PMOS of the switch unit $CM_{32}$ is coupled to the control end $C_2$. The first end of the NMOS of the switch unit $CM_{32}$ is coupled to the input end $I_2$, the second end of the NMOS of the switch unit $CM_{32}$ is coupled to the output end $O_2$, and the control end of the NMOS of the switch unit $CM_{32}$ is coupled to the control end $C_3$.

The switch device $SW_{32}$ comprises three control ends $C_1$, $C_2$, and $C_3$, two input ends $I_1$, and $I_2$, two output ends $O_1$, and $O_2$, and two switch units $CM_{33}$ and $CM_{34}$. The control end $C_1$ of the switch device $SW_{32}$ receives the control signal XBD, the control end $C_2$ of the switch $SW_{32}$ receives the control signal VBD, and the control end $C_3$ of the switch $SW_{32}$ receives the control signal XBD. The input end $I_1$ of the switch device $SW_{32}$ is coupled to the output end $O_3$ of the shift register $SR_2$ for receiving the shift register signal $SRO_2$, the input end $I_2$ of the switch device $SW_{32}$ receives the start signal ST. The output ends $O_1$ and $O_2$ of the switch device $SW_{32}$ are both coupled to the second input end $I_8$ of the shift register $SR_3$ for transmitting signals to the shift register $SR_3$ as the input signal $SRI_{32}$. The switch units $CM_{33}$ and $CM_{34}$ can be realized with any components having switch functions, for example, CMOS. The CMOS transistor comprises two switches. One of the switches of the CMOS transistor is realized with NMOS and the other one of the switches of the CMOS is realized with PMOS. As shown in FIG. 2, the first end of the PMOS of the switch unit $CM_{33}$ is coupled to the input end $I_1$, the second end of the PMOS of the switch unit $CM_{33}$ is coupled to the output end $O_1$, and the control end of the PMOS of the switch unit $CM_{33}$ is coupled to the control end $C_1$. The first end of the NMOS of the switch unit $CM_{33}$ is coupled to the input end $I_1$, the second end of the NMOS of the switch unit $CM_{33}$ is coupled to the output end $O_1$, and the control end of the NMOS of the switch unit $CM_{33}$ is coupled to the control end $C_2$. The first end of the PMOS of the switch unit $CM_{34}$ is coupled to the input end $I_2$, the second end of the PMOS of the switch unit $CM_{34}$ is coupled to the output end $O_2$, and the control end of the PMOS of the switch unit $CM_{34}$ is coupled to the control end $C_2$. The first end of the NMOS of the switch unit $CM_{34}$ is coupled to the input end $I_2$, the second end of the NMOS of the switch unit $CM_{34}$ is coupled to the output end $O_2$, and the control end of the NMOS of the switch unit $CM_{34}$ is coupled to the control end $C_3$.

When the shift register circuit 200 is set to operate in the forward direction, the control signal VBD of the switch set 220 is set at a first predetermined voltage (for example, high voltage), and the control signal XBD of the switch set 220 is set a second predetermined voltage (for example, low voltage). In this way, the switch unit $CM_{11}$ of the switch device $SW_{11}$ is turned on, the switch unit $CM_{12}$ of the switch device $SW_{11}$ is turned off, and consequently the start signal ST is transmitted to the first input end $I_5$ of the shift register $SR_1$ as the input signal $SRI_{11}$; the switch unit $CM_{14}$ of the switch device $SW_{12}$ is turned on, the switch unit $CM_{13}$ of the switch device $SW_{12}$ is turned off, and consequently the shift register signal $SRO_2$ is transmitted to the second input end $I_8$ of the shift register $SR_1$ as the input signal $SRI_{12}$. The switch unit $CM_{21}$ of the switch device $SW_{21}$ is turned on, the switch unit $CM_{22}$ of the switch device $SW_{21}$ is turned off, and consequently the shift register signal $SRO_1$ is transmitted to the first input end $I_5$ of the shift register $SR_2$ as the input signal $SRI_{21}$; the switch unit $CM_{24}$ of the switch device $SW_{22}$ is turned on, the switch unit $CM_{23}$ of the switch device $SW_{22}$ is turned off, and consequently the shift register signal $SRO_3$ is transmitted to the second input end $I_8$ of the shift register $SR_2$ as the input signal $SRI_{22}$. The switch unit $CM_{31}$ of the switch device $SW_{31}$ is turned on, the switch unit $CM_{32}$ of the switch device $SW_{31}$ is turned off, and consequently the shift register signal $SRO_2$ is transmitted to the first input end I5 of the shift register $SR_3$ as the input signal $SRI_{31}$; the switch unit $CM_{34}$ of the switch device $SW_{32}$ is turned on, the switch unit $CM_{33}$ of the switch device $SW_{32}$ is turned off, and consequently the start signal ST is transmitted to the second input end $I_8$ of the shift register $SR_3$ as the input signal $SRI_{32}$.

On the other hand, when the shift register circuit 200 is set to operate in the reverse direction, the control signal VBD of the switch set 220 is set at the second predetermined voltage, and the control signal XBD of the switch set 220 is set at the first predetermined voltage. In this way, the switch unit $CM_{12}$ of the switch device $SW_{11}$ is turned on, the switch unit $CM_{11}$ of the switch device $SW_{11}$ is turned off, and consequently the shift register signal $SRO_2$ is transmitted to the first input end $I_5$ of the shift register $SR_1$ as the input signal $SRI_{11}$; the switch unit $CM_{13}$ of the switch device $SW_{12}$ is turned on, the switch unit $CM_{14}$ of the switch device $SW_{12}$ is turned off, and consequently the start signal ST is transmitted to the second input end $I_8$ of the shift register $SR_1$ as the input signal $SRI_{12}$. The switch unit $CM_{22}$ of the switch device $SW_{21}$ is turned on, the switch unit $CM_{21}$ of the switch device $SW_{21}$ is turned off, and consequently the shift register signal SRO3 is transmitted to the first input end $I_5$ of the shift register $SR_2$ as the input signal $SRI_{21}$; the switch unit $CM_{23}$ of the switch device $SW_{22}$ is turned on, the switch unit $CM_{24}$ of the switch device $SW_{22}$ is turned off, and consequently the shift register signal $SRO_1$ is transmitted to the second input end $I_8$ of the shift register $SR_2$ as the input signal $SRI_{22}$. The switch unit $CM_{32}$ of the switch device $SW_{31}$ is turned on, the switch unit $CM_{31}$ of the switch device $SW_{31}$ is turned off, and consequently the start signal ST is transmitted to the first input end $I_5$ of the shift register $SR_3$ as the input signal $SRI_{31}$; the switch unit $CM_{33}$ of the switch device $SW_{32}$ is turned on, the switch unit $CM_{34}$ of the switch device $SW_{32}$ is turned off, and consequently the shift register signal $SRO_2$ is transmitted to the second input end $I_8$ of the shift register $SR_3$ as the input signal $SRI_{32}$.

The drawback of the conventional switch set 220 is that the control signals VBD and XBD have to respectively keep at the first predetermined voltage and the second predetermined voltage when the shift register circuit 200 is set to operate in the forward direction, and the control signals VBD and XBD have to respectively keep at the second predetermined voltage and the first predetermined voltage when the shift register circuit 200 is set to operate in the reverse direction. Due to the control signals VBD and XBD have to keep at a fixed predetermined voltage for long time, the fixed voltage will cause aging of the switch components, which in turn reduces the lifetime of the switch components, especially when the switch components are amorphous silicon (a-Si) thin film transistors (TFTs).

SUMMARY OF THE INVENTION

The present invention provides a switch set of a bi-directional shift register module. The shift register module comprises a first shift register, a second shift register, and a third shift register. The second shift register is coupled to the first shift register. The third shift register is coupled to the second shift register. The shift register module sequentially transmits shift register signals according to a first clock signal and an inversed clock signal of the first clock signal. The switch set comprises a first switch device and a second switch device. The first switch device comprises a first control end for receiving a second clock signal, a second control end for receiving an inversed clock signal of the second clock signal, a third control end for receiving the second clock signal, a first input end for receiving a start signal, a second input end coupled to an output end of the second shift register, a first output end coupled to an input end of the first shift register for coupling the first input end of the first switch device to the input end of the first shift register when the second clock signal is at a first predetermined voltage, and a second output end coupled to the input end of the first shift register for coupling the second input end of the first switch device to the input end of the first shift register when the inversed clock signal of the second clock signal is at the first predetermined voltage. The second switch device comprises a first control end for receiving the inverse signal of the second clock signal, a second control end for receiving the second clock signal, a third control end for receiving the inversed clock signal of the second clock signal, a first input end coupled to the output end of the first shift register, a second input end coupled to an output end of the third shift register, a first output end coupled to an input end of the second shift register for coupling the first input end of the second switch device to the input end of the second shift register when the inversed clock signal of the second clock signal is at the first predetermined voltage, and a second output end coupled to the input end of the second shift register for coupling the second input end of the second switch device to the input end of the second shift register when the second clock signal is at the first predetermined voltage.

The present invention further provides a switch set of a bi-directional shift register module. The shift register module comprises a first shift register, a second shift register, and a third shift register. The second shift register is coupled to the first shift register. The third shift register is coupled to the second shift register. The shift register module sequentially transmits shift register signals according to a first clock signal and an inversed clock signal of the first clock signal. The switch set comprises a first switch device, a second switch device, a third switch device, and a fourth switch device. The first switch device comprises a first control end for receiving a second clock signal, a second control end for receiving an inversed clock signal of the second clock signal, a third control end for receiving the second clock signal, a first input end for receiving a start signal, a second input end coupled to an output end of the second shift register, a first output end coupled to an input end of the first shift register for coupling the first input end of the first switch device to the first input end of the first shift register when the second clock signal is at a first predetermined voltage, and a second output end coupled to the input end of the first shift register for coupling the second input end of the first switch device to the first input end of the first shift register when the inversed clock signal of the second clock signal is at the first predetermined voltage. The second switch device comprises a first control end for receiving the inversed clock signal of the second clock signal, a second control end for receiving the second clock signal, a third control end for receiving the inversed clock signal of the second clock signal, a first input end for receiving the start signal, a second input end coupled to an output end of the second shift register, a first output end coupled to an second input end of the first shift register for coupling the first input end of the second switch device to the second input end of the first shift register when the inversed clock signal of the second clock signal is at the first predetermined voltage, and a second output end coupled to the second input end of the first shift register for coupling the second input end of the second switch device to the second input end of the first shift register when the second clock signal is at the first predetermined voltage. The third switch device comprises a first control end for receiving the inversed clock signal of the second clock signal, a second control for receiving the second clock signal, a third control for receiving the inversed clock signal of the second clock signal, a first input end coupled to an output end of the first shift register, a second input end coupled to an output end of the third shift register, a first output end coupled to a first input end of the second shift register for coupling the first input end of the third switch device to the first input end of the second shift register when the inversed clock signal of the second clock signal is at the first predetermined voltage, and a second output end coupled to the first input end of the second shift register for coupling the second input end of the third switch device to the first input end of the second shift register when the second clock signal is at the first predetermined voltage. The fourth switch device comprises a first control end for receiving the second clock signal, a second control end for receiving the inversed clock signal of the second clock signal, a third control end for receiving the second clock signal, a first input end coupled to the output end of the first shift register, a second input end coupled to the output end of the third shift register, a first output end coupled to a second input end of the second shift register for coupling the first input end of the fourth switch device to the second end of the second shift register when the second clock signal is at the first predetermined voltage, and a second output end coupled to the second input end of the second shift register for coupling the second input end of the fourth switch device to the second input end of the second shift register when the inversed clock signal of the second clock signal is at the first predetermined voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
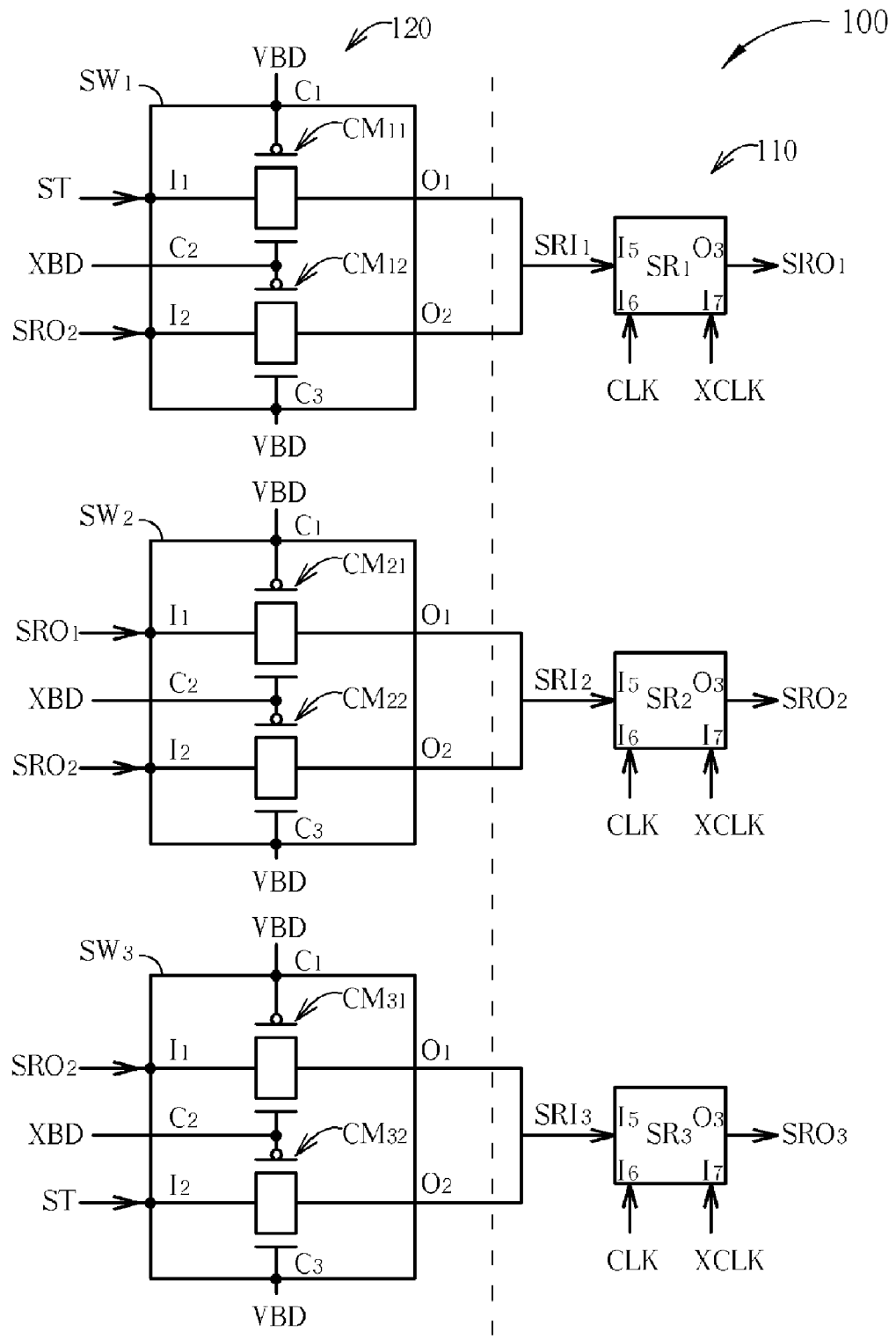
FIG. 1 is a diagram illustrating a conventional bi-directional shift register circuit.
Figure 2:
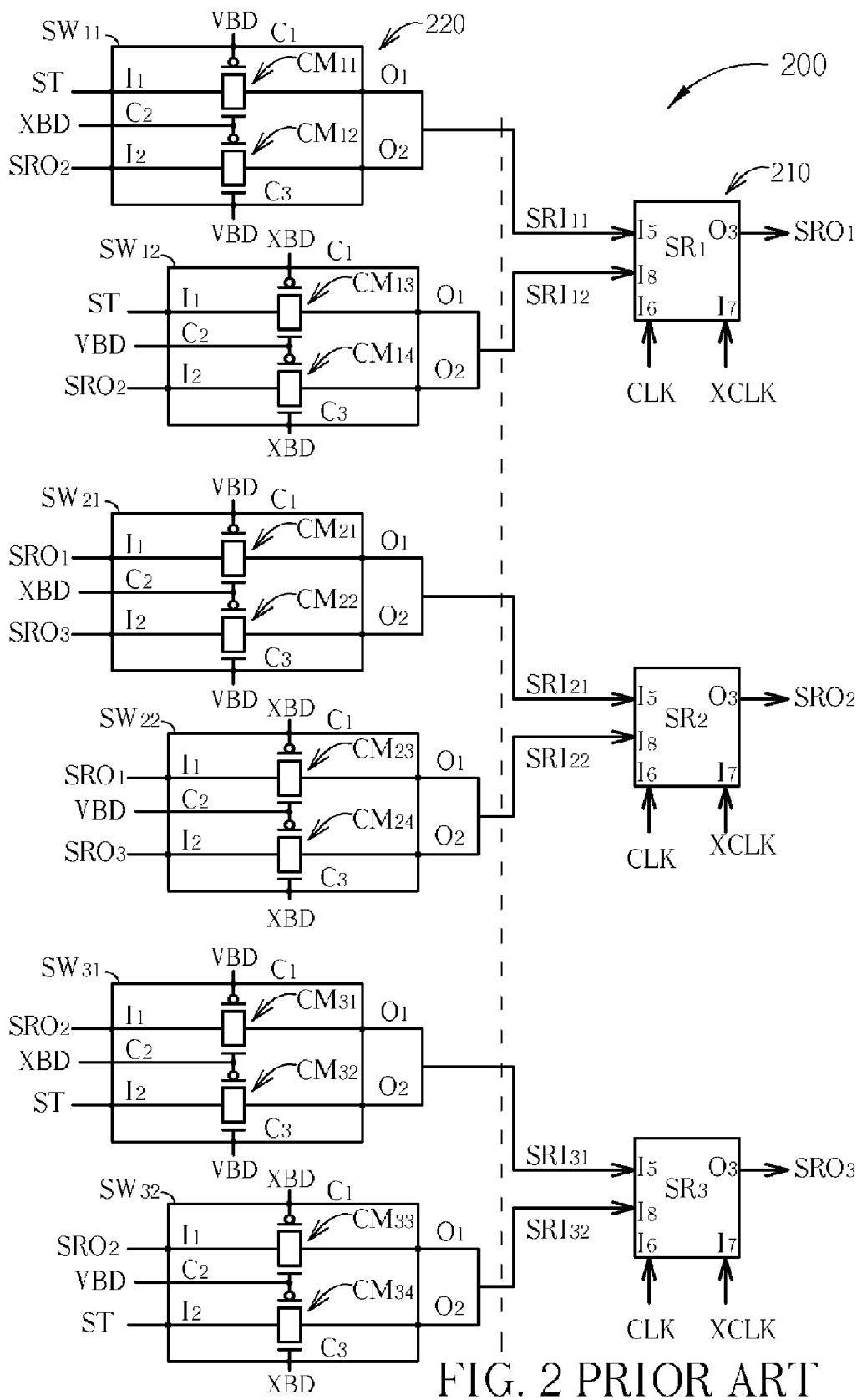
FIG. 2 is a diagram illustrating another conventional bi-directional shift register circuit.
Figure 3:
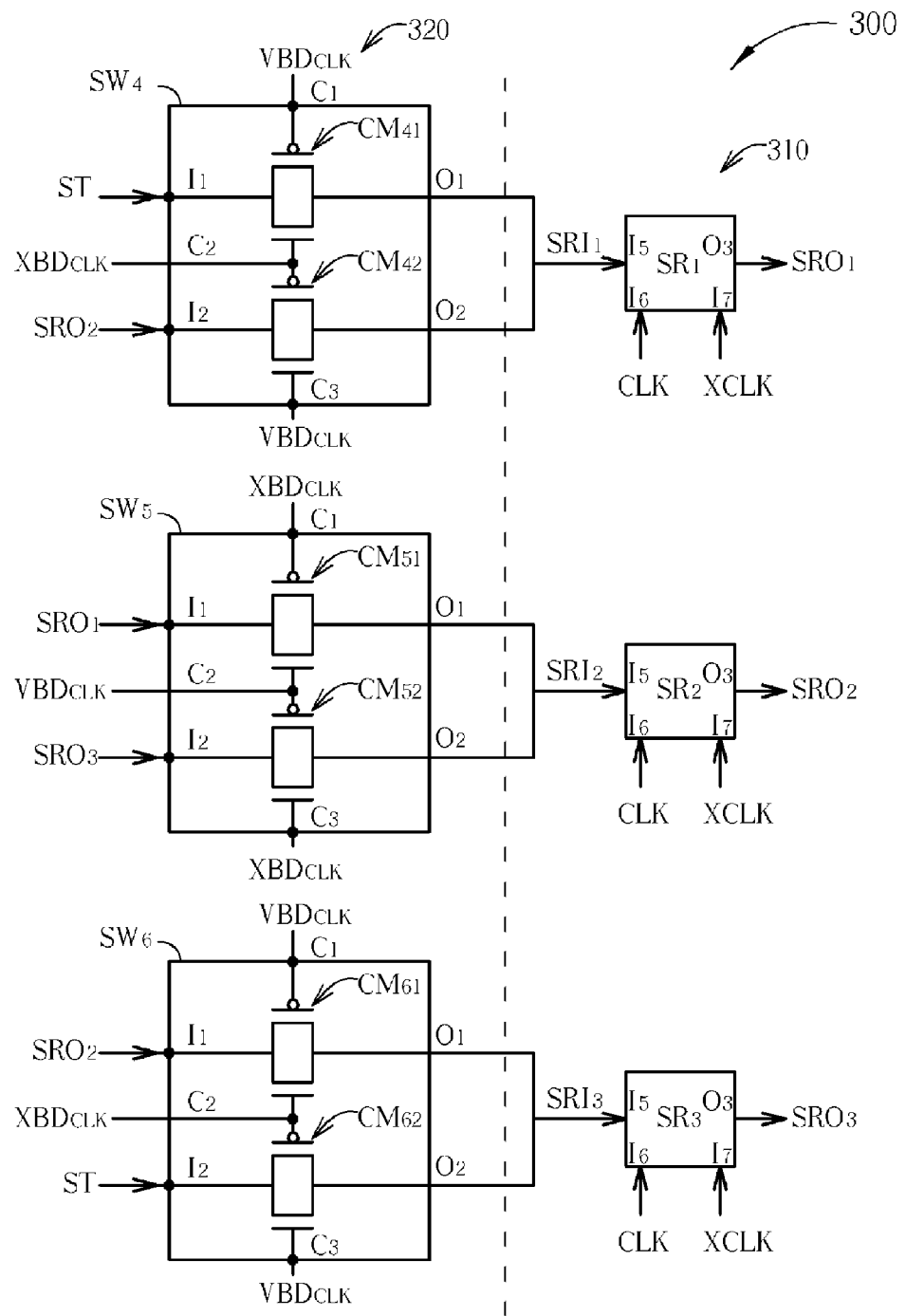
FIG. 3 is a diagram illustrating a first embodiment of the bi-directional shift register circuit of the present invention.

FIG. 3 is a diagram illustrating a first embodiment of the bi-directional shift register circuit 300 of the present invention. The bi-directional shift register circuit 300 comprises shift register module 310 and switch set 320. The shift register module 310 comprises shift registers $SR_1$, $SR_2$, and $SR_3$. The switch set 320 comprises switch devices $SW_4$, $SW_5$, and $SW_6$. Each of the shift registers $SR_1 \sim SR_3$ is a one-to-one shift register. That is, each shift register only receives signals outputted from either the previous shift register or the next shift register as input signals. For example, the shift register $SR_2$ receives either the shift register signal $SRO_1$ from the shift register $SR_1$ or the shift register signal SRO3 from the shift register $SR_3$. Each of the shift registers $SR_1 \sim SR_3$ comprises a first input end $I_5$, a second input end $I_6$, and a third input end $I_7$. The first input end $I_5$ receives a shift register signal, the second input end $I_6$ (clock input end) receives a clock signal, and the third input end $I_7$ (clock input end) receives an inversed clock signal of the clock signal. Each of the shift registers $SR_1 \sim SR_3$ samples the received shift register signal and is triggered to output shift register signals according to the clock signal and the inversed clock signal of the clock signal. The shift register module 310 controls the direction of the transmission of the shift register signals of the shift registers $SR_1 \sim SR_3$ by adjusting clock signal CLK and XCLK. The clock signal XCLK is the inversed clock signal of the clock signal CLK. For example, when the shift register module 310 is set to transmit shift register signals in a first direction (the forward direction), each second input end I6 of the shift registers $SR_1 \sim SR_3$ is input with the clock signal CLK, and each third input end $I_7$ of the shift registers $SR_1 \sim SR_3$ is input with the clock signal XCLK. In this way, the shift register module 310 transmits shift register signals in the first direction. When the shift register module 310 is set to transmit shift register signals in the reverse direction of the forward direction, each second input end I6 of the shift registers $SR_1 \sim SR_3$ is input with the clock signal XCLK, and each third input end $I_7$ of the shift registers $SR_1 \sim SR_3$ is input with the clock signal CLK. In this way, the shift register module 310 transmits shift register signals in the reverse of the first direction.

The switch device $SW_4$ controls the input signal $SRI_1$ of the shift register $SR_1$. The switch device $SW_4$ comprises three control ends $C_1$, $C_2$, and $C_3$, two input ends $I_1$, and $I_2$, two output ends $O_1$, and $O_2$, and two switch units $CM_{41}$ and $CM_{42}$. The control end $C_1$ of the switch device $SW_4$ receives the control signal $VBD_{CLK}$, the control end $C_2$ of the switch device $SW_4$ receives the control signal $XBD_{CLK}$, and the control end $C_3$ of the switch device $SW_4$ receives the control signal $VBD_{CLK}$. The input end $I_1$ of the switch device $SW_4$ receives a start signal ST, the input end $I_2$ of the switch device $SW_4$ is coupled to the output end $O_3$ of the shift register $SR_2$ for receiving the shift register signal $SRO_2$. The output ends $O_1$ and $O_2$ of the switch device $SW_4$ are both coupled to the input end $I_5$ of the shift register $SR_1$ for transmitting the input signal $SRI_1$ to the shift register $SR_1$. The switch units $CM_{41}$ and $CM_{42}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 3, the first end of the PMOS of the switch unit $CM_{41}$ is coupled to the input end $I_1$, the second end of the PMOS of the switch unit $CM_{41}$ is coupled to the output end $O_1$, and the control end of the PMOS of the switch unit $CM_{41}$ is coupled to the control end $C_1$. The first end of the NMOS of the switch unit $CM_{41}$ is coupled to the input end $I_1$, the second end of the NMOS of the switch unit $CM_{41}$ is coupled to the output end $O_1$, and the control end of the NMOS of the switch unit $CM_{41}$ is coupled to the control end $C_2$. The first end of the PMOS of the switch unit $CM_{42}$ is coupled to the input end $I_2$, the second end of the PMOS of the switch unit $CM_{42}$ is coupled to the output end $O_2$, and the control end of the PMOS of the switch unit $CM_{42}$ is coupled to the control end $C_2$. The first end of the NMOS of the switch unit $CM_{42}$ is coupled to the input end $I_2$, the second end of the NMOS of the switch unit $CM_{42}$ is coupled to the output end $O_2$, and the control end of the NMOS of the switch unit $CM_{42}$ is coupled to the control end $C_3$.

The switch device $SW_5$ controls the input signal $SRI_2$ of the shift register $SR_2$. The switch device $SW_5$ comprises three control ends $C_1$, $C_2$, and $C_3$, two input ends $I_1$, and $I_2$, two output ends $O_1$, and $O_2$, and two switch units $CM_5$, and $CM_{52}$. The control end $C_1$ of the switch device $SW_5$ receives the control signal $XBD_{CLK}$, the control end $C_2$ of the switch device $SW_5$ receives the control signal $VBD_{CLK}$, and the control end $C_3$ of the switch device $SW_5$ receives the control signal $XBD_{CLK}$. The input end $I_1$ of the switch device $SW_5$ is coupled to the output end $O_3$ of the shift register $SR_1$ for receiving the shift register signal $SRO_1$, the input end $I_2$ of the switch device $SW_5$ is coupled to the output end $O_3$ of the shift register $SR_3$ for receiving the shift register signal $SRO_3$. The output ends $O_1$ and $O_2$ of the switch device $SW_5$ are both coupled to the input end $I_5$ of the shift register $SR_2$ for transmitting the input signal $SRI_2$ to the shift register $SR_2$. The switch units $CM_{51}$ and $CM_{52}$ can be realized with any components having switch functions, for example, CMOS. The CMOS transistor comprises two switches. One of the switches of the CMOS transistor is realized with NMOS and the other one of the switches of the CMOS is realized with PMOS. As shown in FIG. 3, the first end of the PMOS of the switch unit CM51 is coupled to the input end $I_1$, the second end of the PMOS of the switch unit $CM_{51}$ is coupled to the output end $O_1$, and the control end of the PMOS of the switch unit $CM_{51}$ is coupled to the control end $C_1$. The first end of the NMOS of the switch unit $CM_{51}$ is coupled to the input end $I_1$, the second end of the NMOS of the switch unit $CM_5$, is coupled to the output end $O_1$, and the control end of the NMOS of the switch unit $CM_5$, is coupled to the control end C2. The first end of the PMOS of the switch unit $CM_{52}$ is coupled to the input end $I_2$, the second end of the PMOS of the switch unit $CM_{52}$ is coupled to the output end $O_2$, and the control end of the PMOS of the switch unit $CM_{52}$ is coupled to the control end $C_2$. The first end of the NMOS of the switch unit $CM_{52}$ is coupled to the input end $I_2$, the second end of the NMOS of the switch unit $CM_{52}$ is coupled to the output end $O_2$, and the control end of the NMOS of the switch unit $CM_{52}$ is coupled to the control end $C_3$.

The switch device $SW_6$ controls the input signal $SRI_3$ of the shift register $SR_3$. The switch device $SW_6$ comprises three control ends $C_1$, $C_2$, and $C_3$, two input ends $I_1$, and $I_2$, two output ends $O_1$, and $O_2$, and two switch units $CM_{61}$ and $CM_{62}$. The control end $C_1$ of the switch device $SW_6$ receives the control signal $VBD_{CLK}$, the control end $C_2$ of the switch device $SW_6$ receives the control signal $XBD_{CLK}$, and the control end $C_3$ of the switch device $SW_6$ receives the control signal $VBD_{CLK}$. The input end $I_1$ of the switch device $SW_6$ is coupled to the output end $O_3$ of the shift register $SR_2$ for receiving the shift register signal $SRO_2$, the input end $I_2$ of the switch device $SW_6$ receives the start signal ST. The output ends $O_1$ and $O_2$ of the switch device $SW_6$ are both coupled to the input end $I_5$ of the shift register $SR_3$ for transmitting the input signal $SRI_3$ to the shift register $SR_3$. The switch units $CM_{61}$ and $CM_{62}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 3, the first end of the PMOS of the switch unit $CM_{61}$ is coupled to the input end $I_1$, the second end of the PMOS of the switch unit $CM_{61}$ is coupled to the output end $O_1$, and the control end of the PMOS of the switch unit $CM_{61}$ is coupled to the control end $C_1$. The first end of the NMOS of the switch unit $CM_{61}$ is coupled to the input end $I_1$, the second end of the NMOS of the switch unit $CM_{61}$ is coupled to the output end $O_1$, and the control end of the NMOS of the switch unit $CM_{61}$ is coupled to the control end $C_2$. The first end of the PMOS of the switch unit $CM_{62}$ is coupled to the input end $I_2$, the second end of the PMOS of the switch unit $CM_{62}$ is coupled to the output end $O_2$, and the control end of the PMOS of the switch unit $CM_{62}$ is coupled to the control end $C_2$. The first end of the NMOS of the switch unit $CM_{62}$ is coupled to the input end $I_2$, the second end of the NMOS of the switch unit $CM_{62}$ is coupled to the output end $O_2$, and the control end of the NMOS of the switch unit $CM_{62}$ is coupled to the control end $C_3$.

In the preferred embodiment, it is noticeable that the control signals $VBD_{CLK}$ and $XBD_{CLK}$ have opposite polarity and have the same frequency as the clock signal CLK. Additionally, the duty ratio of the control signals $VBD_{CLK}$ and $XBD_{CLK}$ are adjustable as desired. When the shift register circuit 300 is changed from the forward direction to the reverse direction or from the reverse direction to the forward direction, the control signals $VBD_{CLK}$ and $XBD_{CLK}$ remain the same and only the phases of the clock signals CLK and XCLK change.

Figure 4:
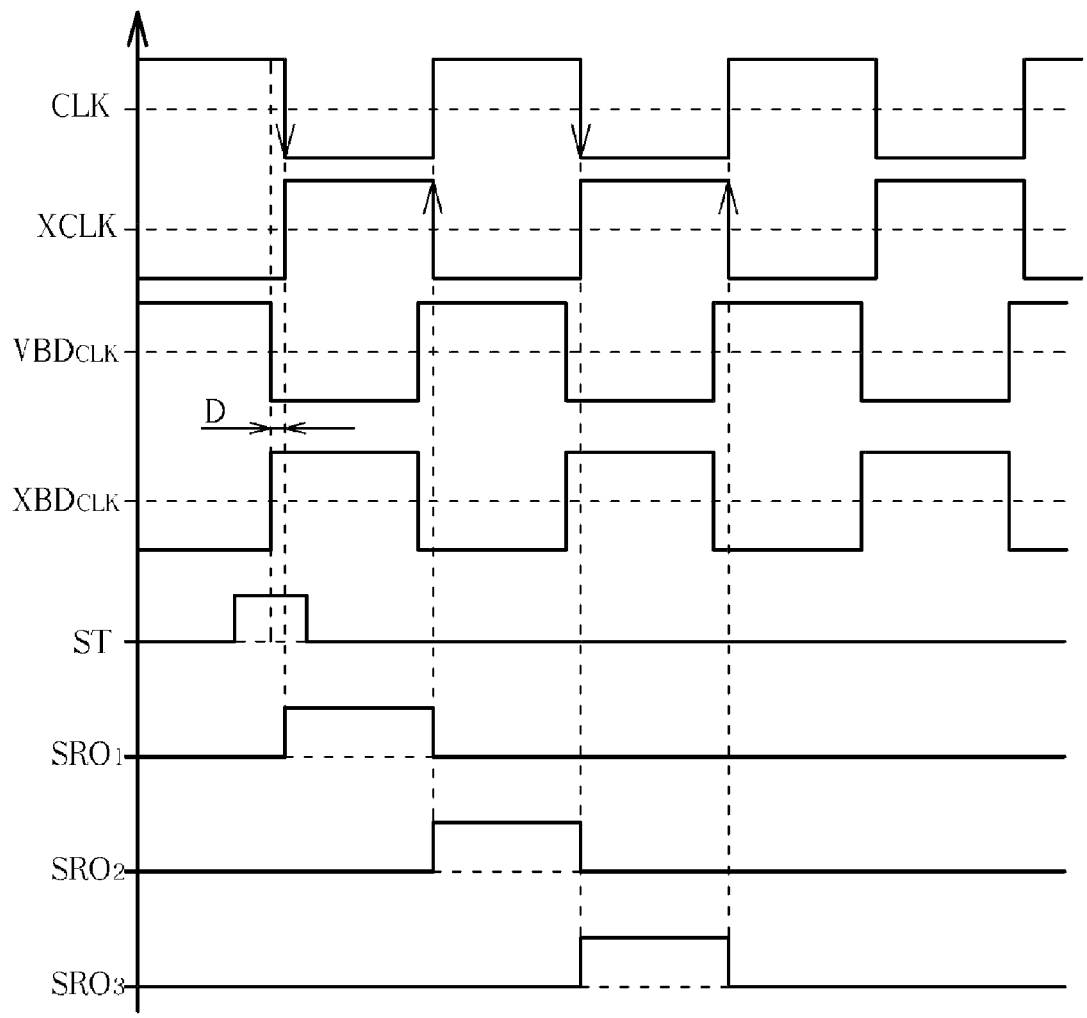
FIG. 4 is a timing diagram of a shift register circuit according to the first embodiment of the present invention.

FIG. 4 is a timing diagram of the shift register circuit 300 of the first embodiment of the present invention. As shown in FIG. 4, there is a phase difference D between the control signals $VBD_{CLK}$ and $XBD_{CLK}$ and the clock signals CLK and XCLK. The phase difference D is disposed for ensuring the sampling of the shift register from the input signals is valid. Assuming in the forward direction, each of the shift registers $SR_1$~$SR_3$ respectively samples the input signals $SRI_1$~$SRI_3$ at the falling edges of the clock signal CLK, and stops outputting shift register signals $SRO_1$~$SRO_3$ at the rising clock signal XCLK. Thus, as for the shift register $SR_1$, when the start signal ST is input, the control signal $VBD_{CLK}$ is at the low voltage (while the control signal $XBD_{CLK}$ is at the high voltage), which turns on the switch unit $CM_{41}$, turns off the switch unit $CM_{42}$, and thus the start signal ST is served as the input signal $SRI_1$. As for the shift register $SR_2$, when the shift register signal $SRO_1$ is input, the control signal $XBD_{CLK}$ is at the low voltage (while the control signal $VBD_{CLK}$ is at the high voltage), which turns on the switch unit $CM_{51}$, turns off the switch unit $CM_{52}$, and thus the shift register signal $SRO_1$ is served as the input signal $SRI_2$. As for the shift register $SR_3$, when the shift register signal $SRO_2$ is input, the control signal $VBD_{CLK}$ is at the low voltage (while the control signal $XBD_{CLK}$ is at the high voltage), which turns on the switch unit $CM_{61}$, turns off the switch unit $CM_{62}$, and thus the shift register signal $SRO_2$ is served as the input signal $SRI_3$. In this way, the transmission of the shift register signals in the forward direction is achieved by utilizing the phases of the clock signals CLK and XCLK. The operation of the transmission of the shift register signals in the reverse direction is similar and is omitted.

Figure 5:
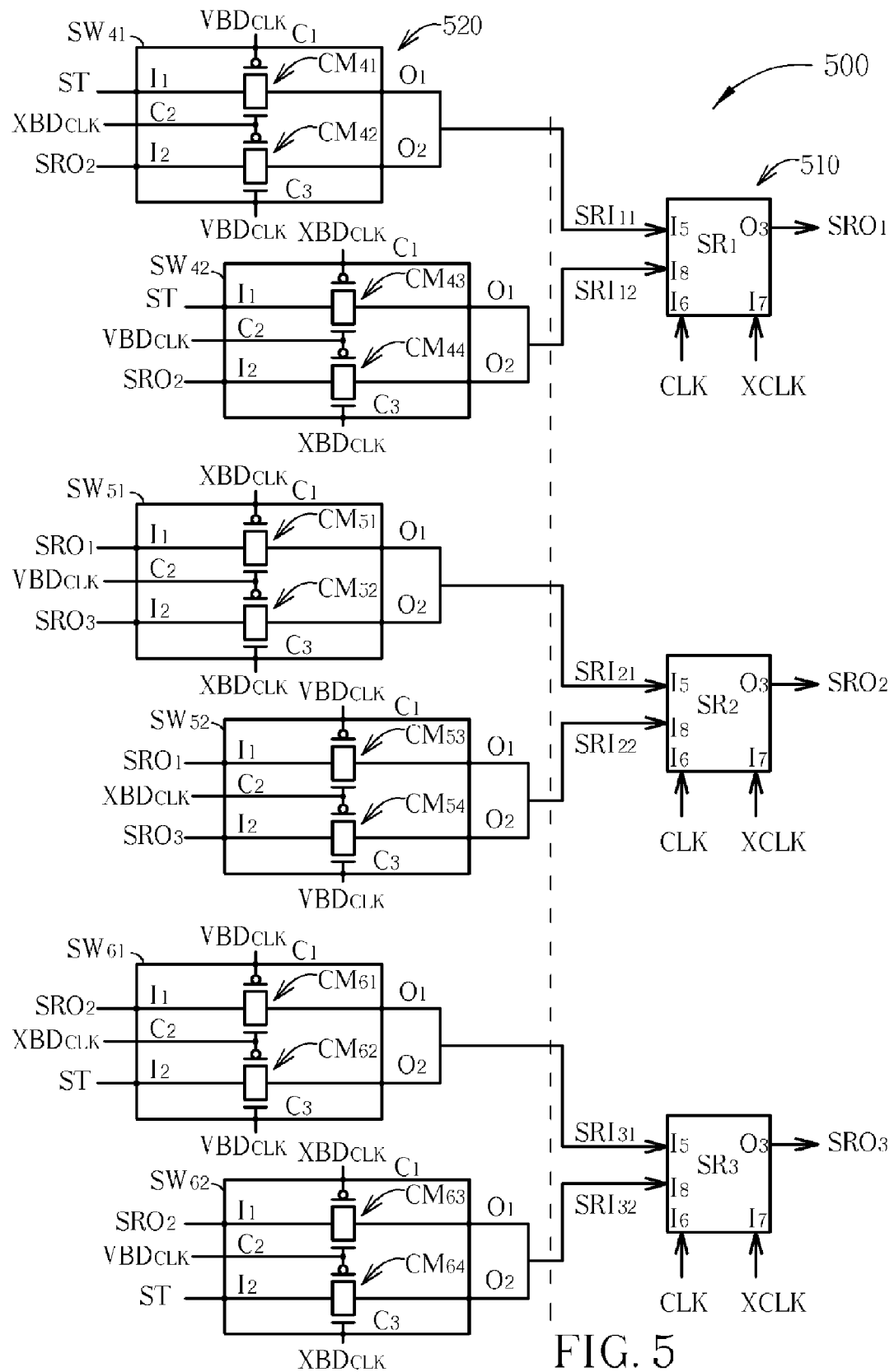
FIG. 5 is a diagram illustrating a second embodiment of the bi-directional shift register circuit of the present invention.

FIG. 5 is a diagram illustrating a second embodiment of the bi-directional shift register circuit 500 of the present invention. The bi-directional shift register circuit 500 comprises shift register module 510 and switch set 520. The shift register module 510 comprises shift registers $SR_1$, $SR_2$, and $SR_3$. The switch set 520 comprises switch devices $SW_{41}$, $SW_{42}$, $SW_{51}$, $SW_{52}$, $SW_{61}$, and $SW_{62}$. Each of the shift registers $SR_1$~$SR_3$ is a two-to-one shift register. That is, each shift register receives signals outputted both from the previous shift register and the next shift register as input signals. For example, the shift register $SR_2$ receives both of the shift register signal $SRO_1$ from the shift register $SR_1$ and the shift register signal $SRO_3$ from the shift register $SR_3$. Each of the shift registers $SR_1$~$SR_3$ comprises a first input end $I_5$, a second input end $I_6$, a third input end $I_7$, and a fourth input end $I_8$. The first input end $I_5$ receives a shift register signal, the second input end $I_6$ (clock input end) receives a clock signal, the third input end $I_7$ (clock input end) receives the inversed clock signal of the clock signal, and the fourth input end $I_8$ receives another shift register signal. Each of the shift registers $SR_1$~$SR_3$ samples the received shift register signals and is triggered to output shift register signals according to the clock signal and the inversed clock signal of the clock signal. The shift register module 510 controls the direction of the transmission of the shift register signals of the shift registers $SR_1$~$SR_3$ by adjusting clock signal CLK and XCLK. The clock signal XCLK is the inversed clock signal of the clock signal CLK. For example, when the shift register module 510 is set to transmit shift register signals at the forward direction, each second input end I6 of the shift registers $SR_1$~$SR_3$ is input with the clock signal CLK, and each third input end $I_7$ of the shift registers $SR_1$~$SR_3$ is input with the clock signal XCLK. In this way, the shift register module 510 transmits shift register signals in the forward direction. When the shift register module 510 is set to transmit shift register signals in the reverse direction, each second input end I6 of the shift registers $SR_1$~$SR_3$ is input with the clock signal XCLK, and each third input end $I_7$ of the shift registers $SR_1$~$SR_3$ is input with the clock signal CLK. In this way, the shift register module 510 transmits shift register signals in the reverse direction.

The switch device $SW_{41}$ controls the input signal $SRI_{11}$ of the shift register $SR_1$. The switch device $SW_{42}$ controls the input signal $SRI_{12}$ of the shift register $SR_1$. The switch device $SW_{41}$ comprises three control ends $C_1$, $C_2$, and $C_3$, two input ends $I_1$, and $I_2$, two output ends $O_1$, and $O_2$, and two switch units $CM_{41}$ and $CM_{42}$. The control end $C_1$ of the switch device $SW_{41}$ receives the control signal $VBD_{CLK}$, the control end $C_2$ of the switch device $SW_{41}$ receives the control signal $XBD_{CLK}$, and the control end $C_3$ of the switch device $SW_{41}$ receives the control signal $VBD_{CLK}$. The input end $I_1$ of the switch device $SW_{41}$ receives the start signal ST, the input end $I_2$ of the switch device $SW_{41}$ is coupled to the output end $O_3$ of the shift register $SR_2$ for receiving the shift register signal $SRO_2$. The output ends $O_1$ and $O_2$ of the switch device $SW_{41}$ are both coupled to the first input end $I_5$ of the shift register $SR_1$ for transmitting signals to the shift register $SR_1$ as the input signals $SRI_{11}$. The switch units $CM_{41}$ and $CM_{42}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 5, the first end of the PMOS of the switch unit $CM_{41}$ is coupled to the input end $I_1$, the second end of the PMOS of the switch unit $CM_{41}$ is coupled to the output end $O_1$, and the control end of the PMOS of the switch unit $CM_{41}$ is coupled to the control end $C_1$. The first end of the NMOS of the switch unit $CM_{41}$ is coupled to the input end $I_1$, the second end of the NMOS of the switch unit $CM_{41}$ is coupled to the output end $O_1$, and the control end of the NMOS of the switch unit $CM_{41}$ is coupled to the control end $C_2$. The first end of the PMOS of the switch unit $CM_{42}$ is coupled to the input end $I_2$, the second end of the PMOS of the switch unit $CM_{42}$ is coupled to the output end $O_2$, and the control end of the PMOS of the switch unit $CM_{42}$ is coupled to the control end $C_2$. The first end of the NMOS of the switch unit $CM_{42}$ is coupled to the input end $I_2$, the second end of the NMOS of the switch unit $CM_{42}$ is coupled to the output end $O_2$, and the control end of the NMOS of the switch unit $CM_{42}$ is coupled to the control end $C_3$.

The switch device $SW_{42}$ comprises three control ends $C_1$, $C_2$, and $C_3$, two input ends $I_1$, and $I_2$, two output ends $O_1$, and $O_2$, and two switch units $CM_{43}$ and $CM_{44}$. The control end $C_1$ of the switch device $SW_{42}$ receives the control signal $XBD_{CLK}$, the control end $C_2$ of the switch device $SW_{42}$ receives the control signal $VBD_{CLK}$, and the control end $C_3$ of the switch device $SW_{42}$ receives the control signal $XBD_{CLK}$. The input end $I_1$ of the switch device $SW_{42}$ receives the start signal ST, the input end $I_2$ of the switch device $SW_{42}$ is coupled to the output end $O_3$ of the shift register $SR_2$ for receiving the shift register signal $SRO_2$. The output ends $O_1$ and $O_2$ of the switch device $SW_{42}$ are both coupled to the second input end $I_8$ of the shift register $SR_1$ for transmitting signals to the shift register $SR_2$ as the input signal $SRI_{12}$. The switch units $CM_{43}$ and $CM_{44}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 5, the first end of the PMOS of the switch unit $CM_{43}$ is coupled to the input end $I_1$, the second end of the PMOS of the switch unit $CM_{43}$ is coupled to the output end $O_1$, and the control end of the PMOS of the switch unit $CM_{43}$ is coupled to the control end $C_1$. The first end of the NMOS of the switch unit $CM_{43}$ is coupled to the input end $I_1$, the second end of the NMOS of the switch unit $CM_{43}$ is coupled to the output end $O_1$, and the control end of the NMOS of the switch unit $CM_{43}$ is coupled to the control end $C_2$. The first end of the PMOS of the switch unit $CM_{44}$ is coupled to the input end $I_2$, the second end of the PMOS of the switch unit $CM_{44}$ is coupled to the output end $O_2$, and the control end of the PMOS of the switch unit $CM_{44}$ is coupled to the control end $C_2$. The first end of the NMOS of the switch unit $CM_{44}$ is coupled to the input end $I_2$, the second end of the NMOS of the switch unit $CM_{44}$ is coupled to the output end $O_2$, and the control end of the NMOS of the switch unit $CM_{44}$ is coupled to the control end $C_3$.

The switch device $SW_{51}$ controls the input signal $SRI_{21}$ of the shift register $SR_2$. The switch device $SW_{52}$ controls the input signal $SRI_{22}$ of the shift register $SR_2$. The switch device $SW_{51}$ comprises three control ends $C_1$, $C_2$, and $C_3$, two input ends $I_1$, and $I_2$, two output ends $O_1$, and $O_2$, and two switch units $CM_{51}$ and $CM_{52}$. The control end $C_1$ of the switch device $SW_{51}$ receives the control signal $XBD_{CLK}$, the control end $C_2$ of the switch device $SW_{51}$ receives the control signal $VBD_{CLK}$, and the control end $C_3$ of the switch device $SW_{51}$ receives the control signal $XBD_{CLK}$. The input end $I_1$ of the switch device $SW_{51}$ is coupled to the output end $O_3$ of the shift register $SR_1$ for receiving the shift register signal $SRO_1$, the input end $I_2$ of the switch device $SW_{51}$ is coupled to the output end $O_3$ of the shift register $SR_3$ for receiving the shift register signal $SRO_3$. The output ends $O_1$ and $O_2$ of the switch device $SW_{51}$ are both coupled to the first input end $I_5$ of the shift register $SR_2$ for transmitting signals to the shift register $SR_2$ as the input signals $SRI_{21}$. The switch units $CM_{51}$ and $CM_{52}$ can be realized with any components having switch functions, for example, CMOS. The CMOS transistor comprises two switches. One of the switches of the CMOS transistor is realized with NMOS and the other one of the switches of the CMOS is realized with PMOS. As shown in FIG. 5, the first end of the PMOS of the switch unit $CM_{51}$ is coupled to the input end $I_1$, the second end of the PMOS of the switch unit $CM_{51}$ is coupled to the output end $O_1$, and the control end of the PMOS of the switch unit $CM_{51}$ is coupled to the control end $C_1$. The first end of the NMOS of the switch unit $CM_{51}$ is coupled to the input end $I_1$, the second end of the NMOS of the switch unit $CM_{51}$ is coupled to the output end $O_1$, and the control end of the NMOS of the switch unit $CM_{51}$ is coupled to the control end $C_2$. The first end of the PMOS of the switch unit $CM_{52}$ is coupled to the input end $I_2$, the second end of the PMOS of the switch unit $CM_{52}$ is coupled to the output end $O_2$, and the control end of the PMOS of the switch unit $CM_{52}$ is coupled to the control end $C_2$. The first end of the NMOS of the switch unit $CM_{52}$ is coupled to the input end $I_2$, the second end of the NMOS of the switch unit $CM_{52}$ is coupled to the output end $O_2$, and the control end of the NMOS of the switch unit $CM_{52}$ is coupled to the control end $C_3$.

The switch device $SW_{52}$ comprises three control ends $C_1$, $C_2$, and $C_3$, two input ends $I_1$, and $I_2$, two output ends $O_1$, and $O_2$, and two switch units $CM_{53}$ and $CM_{54}$. The control end $C_1$ of the switch device $SW_{52}$ receives the control signal $VBD_{CLK}$, the control end $C_2$ of the switch device $SW_{52}$ receives the control signal $XBD_{CLK}$, and the control end $C_3$ of the switch device $SW_{52}$ receives the control signal $VBD_{CLK}$. The input end $I_1$ of the switch device $SW_{52}$ is coupled to the output end $O_3$ of the shift register $SR_1$ for receiving the shift register signal $SRO_1$, the input end $I_2$ of the switch device $SW_{52}$ is coupled to the output end $O_3$ of the shift register $SR_3$ for receiving the shift register signal $SRO_3$. The output ends $O_1$ and $O_2$ of the switch device $SW_{52}$ are both coupled to the second input end $I_8$ of the shift register $SR_2$ for transmitting signals to the shift register $SR_2$ as the input signal $SRI_{12}$. The switch units $CM_{53}$ and $CM_{54}$ can be realized with any components having switch functions, for example, CMOS. The CMOS transistor comprises two switches. One of the switches of the CMOS transistor is realized with NMOS and the other one of the switches of the CMOS is realized with PMOS. As shown in FIG. 5, the first end of the PMOS of the switch unit $CM_{53}$ is coupled to the input end $I_1$, the second end of the PMOS of the switch unit $CM_{53}$ is coupled to the output end $O_1$, and the control end of the PMOS of the switch unit $CM_{53}$ is coupled to the control end $C_1$. The first end of the NMOS of the switch unit $CM_{53}$ is coupled to the input end $I_1$, the second end of the NMOS of the switch unit $CM_{53}$ is coupled to the output end $O_1$, and the control end of the NMOS of the switch unit $CM_{53}$ is coupled to the control end $C_2$. The first end of the PMOS of the switch unit $CM_{54}$ is coupled to the input end $I_2$, the second end of the PMOS of the switch unit $CM_{54}$ is coupled to the output end $O_2$, and the control end of the PMOS of the switch unit $CM_{54}$ is coupled to the control end $C_2$. The first end of the NMOS of the switch unit $CM_{54}$ is coupled to the input end $I_2$, the second end of the NMOS of the switch unit $CM_{54}$ is coupled to the output end $O_2$, and the control end of the NMOS of the switch unit $CM_{54}$ is coupled to the control end $C_3$.

The switch device $SW_{61}$ controls the input signal $SRI_{31}$ of the shift register $SR_3$. The switch device $SW_{62}$ controls the input signal $SRI_{32}$ of the shift register $SR_3$. The switch device $SW_{61}$ comprises three control ends $C_1$, $C_2$, and $C_3$, two input ends $I_1$, and $I_2$, two output ends $O_1$, and $O_2$, and two switch units $CM_{61}$ and $CM_{62}$. The control end $C_1$ of the switch device $SW_{61}$ receives the control signal $VBD_{CLK}$, the control end $C_2$ of the switch device $SW_{61}$ receives the control signal $XBD_{CLK}$, and the control end $C_3$ of the switch device $SW_{61}$ receives the control signal $VBD_{CLK}$. The input end $I_1$ of the switch device $SW_{61}$ is coupled to the output end $O_3$ of the shift register $SR_2$ for receiving the shift register signal $SRO_2$, the input end $I_2$ of the switch device $SW_{61}$ receives the start signal ST. The output ends $O_1$ and $O_2$ of the switch device $SW_{61}$ are both coupled to the first input end $I_5$ of the shift register $SR_3$ for transmitting signals to the shift register $SR_3$ as the input signals $SRI_{31}$. The switch units $CM_{61}$ and $CM_{62}$ can be realized with any components having switch functions, for example, CMOS. The CMOS transistor comprises two switch units. One of the switch units of the CMOS transistor is realized with NMOS and the other one of the switch units of the CMOS is realized with PMOS. As shown in FIG. 5, the first end of the PMOS of the switch unit $CM_{61}$ is coupled to the input end $I_1$, the second end of the PMOS of the switch unit $CM_{61}$ is coupled to the output end $O_1$, and the control end of the PMOS of the switch unit $CM_{61}$ is coupled to the control end $C_1$. The first end of the NMOS of the switch unit $CM_{61}$ is coupled to the input end $I_1$, the second end of the NMOS of the switch unit $CM_{61}$ is coupled to the output end $O_1$, and the control end of the NMOS of the switch unit $CM_{61}$ is coupled to the control end $C_2$. The first end of the PMOS of the switch unit $CM_{62}$ is coupled to the input end $I_2$, the second end of the PMOS of the switch unit $CM_{62}$ is coupled to the output end $O_2$, and the control end of the PMOS of the switch unit $CM_{62}$ is coupled to the control end $C_2$. The first end of the NMOS of the switch unit $CM_{62}$ is coupled to the input end $I_2$, the second end of the NMOS of the switch unit $CM_{62}$ is coupled to the output end $O_2$, and the control end of the NMOS of the switch unit $CM_{62}$ is coupled to the control end $C_3$.

The switch device $SW_{62}$ comprises three control ends $C_1$, $C_2$, and $C_3$, two input ends $I_1$, and $I_2$, two output ends $O_1$, and $O_2$, and two switch units $CM_{63}$ and $CM_{64}$. The control end $C_1$ of the switch device $SW_{62}$ receives the control signal $XBD_{CLK}$, the control end $C_2$ of the switch device $SW_{62}$ receives the control signal $VBD_{CLK}$, and the control end $C_3$ of the switch device $SW_{62}$ receives the control signal $XBD_{CLK}$. The input end $I_1$ of the switch device $SW_{62}$ is coupled to the output end $O_3$ of the shift register $SR_2$ for receiving the shift register signal $SRO_2$, the input end $I_2$ of the switch device $SW_{62}$ receives the start signal ST. The output ends $O_1$ and $O_2$ of the switch device $SW_{62}$ are both coupled to the second input end $I_8$ of the shift register $SR_3$ for transmitting signals to the shift register $SR_3$ as the input signal $SRI_{32}$. The switch units $CM_{63}$ and $CM_{64}$ can be realized with any components having switch functions, for example, CMOS. The CMOS transistor comprises two switch units. One of the switch units of the CMOS transistor is realized with NMOS and the other one of the switch units of the CMOS is realized with PMOS.

As shown in FIG. 5, the first end of the PMOS of the switch unit $CM_{63}$ is coupled to the input end $I_1$, the second end of the PMOS of the switch unit $CM_{63}$ is coupled to the output end $O_1$, and the control end of the PMOS of the switch unit $CM_{63}$ is coupled to the control end $C_1$. The first end of the NMOS of the switch unit $CM_{63}$ is coupled to the input end $I_1$, the second end of the NMOS of the switch unit $CM_{63}$ is coupled to the output end $O_1$, and the control end of the NMOS of the switch unit $CM_{63}$ is coupled to the control end $C_2$. The first end of the PMOS of the switch unit $CM_{64}$ is coupled to the input end $I_2$, the second end of the PMOS of the switch unit $CM_{64}$ is coupled to the output end $O_2$, and the control end of the PMOS of the switch unit $CM_{64}$ is coupled to the control end $C_2$. The first end of the NMOS of the switch unit $CM_{64}$ is coupled to the input end $I_2$, the second end of the NMOS of the switch unit $CM_{64}$ is coupled to the output end $O_2$, and the control end of the NMOS of the switch unit $CM_{64}$ is coupled to the control end $C_3$.

In the preferred embodiment, it is noticeable that the control signals $VBD_{CLK}$ and $XBD_{CLK}$ have opposite polarity and have the same frequency as the clock signal CLK. Additionally, the duty ratio of the control signals $VBD_{CLK}$ and $XBD_{CLK}$ are adjustable as desired. When the shift register circuit 500 is changed from the forward direction to the reverse direction or from the reverse direction to the forward direction, the control signals $VBD_{CLK}$ and $XBD_{CLK}$ remain the same and only the phases of the clock signals CLK and XCLK changed.

Figure 6:
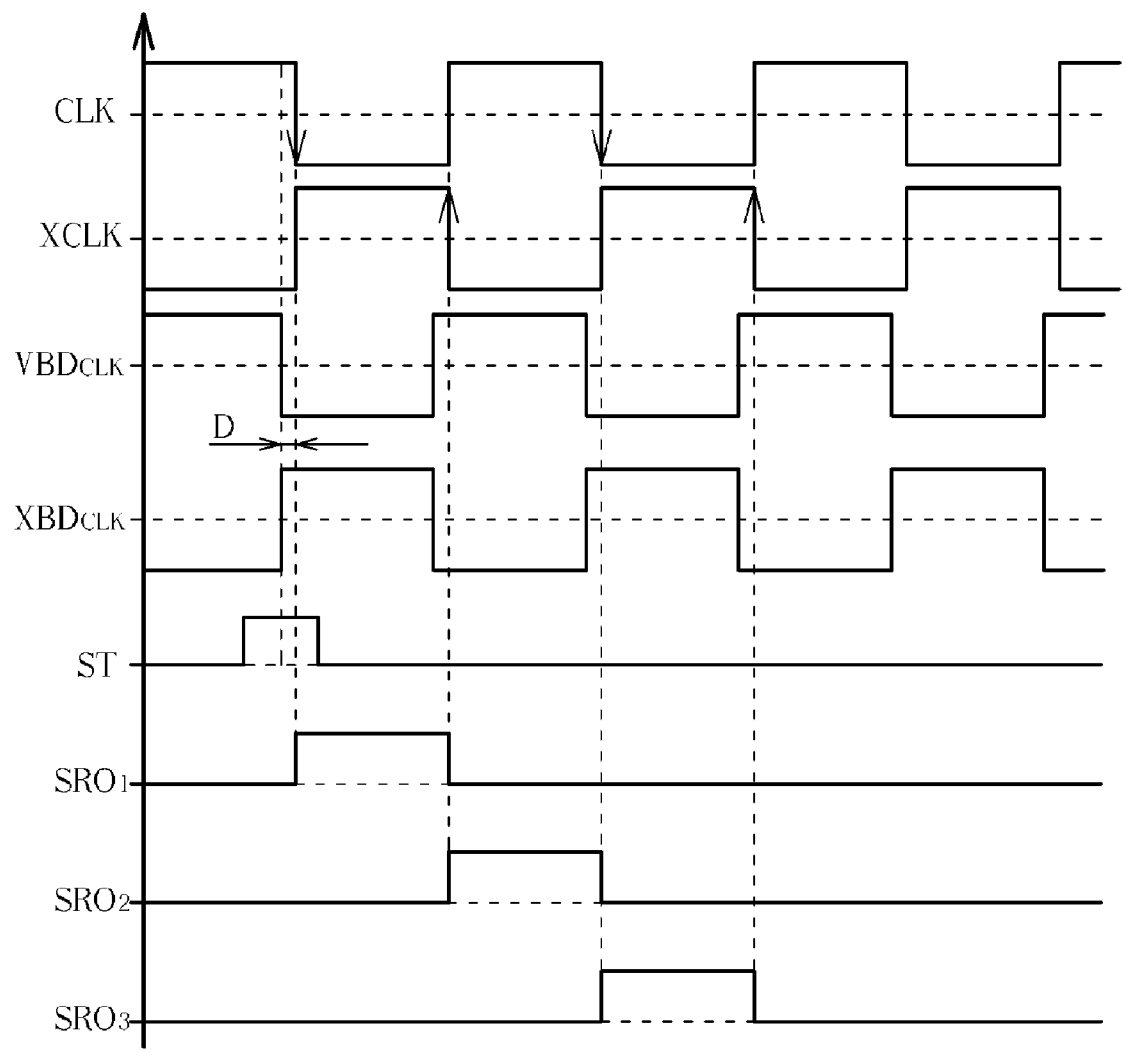
FIG. 6 is a timing diagram of a shift register circuit according to the second embodiment of the present invention.

FIG. 6 is a timing diagram of the shift register circuit 500 of the second embodiment of the present invention. As shown in FIG. 6, there is a phase difference D between the control signals $VBD_{CLK}$ and $XBD_{CLK}$ and the clock signals CLK and XCLK. The phase difference D is disposed for ensuring the sampling of the shift register from the input signals is valid. Assuming in the forward direction, each of the shift registers $SR_1$~$SR_3$ respectively samples the input signals $SRI_{11}$~$SRI_{31}$ at the falling edges of the clock signal CLK, each of the shift registers $SR_1$~$SR_3$ respectively samples the input signals $SRI_{12}$~$SRI_{32}$ at the rising edges of the clock signal XCLK for stopping outputting shift register signals $SRO_1$~$SRO_3$. Thus, as for the shift register $SR_1$, when the start signal ST is input, the control signal $VBD_{CLK}$ is at the low voltage (while the control signal $XBD_{CLK}$ is at the high voltage), which turns on the switch unit $CM_{41}$, turns off the switch unit $CM_{42}$, and thus the start signal ST is served as the input signal $SRI_{11}$; when the shift register signal $SRO_2$ is input, the control signal $XBD_{CLK}$ is at the low voltage (while the control signal $VBD_{CLK}$ is at the high voltage), which turns on the switch unit $CM_{43}$, turns off the switch unit $CM_{44}$, and thus the shift register signal $SRO_2$ is served as the input signal $SRI_{12}$. As for the shift register $SR_2$, when the shift register signal $SRO_1$ is input, the control signal $XBD_{CLK}$ is at the low voltage (while the control signal $VBD_{CLK}$ is at the high voltage), which turns on the switch unit $CM_{51}$, turns off the switch unit $CM_{52}$, and thus the shift register signal $SRO_1$ is served as the input signal $SRI_{21}$; when the shift register signal $SRO_3$ is input, the control signal $VBD_{CLK}$ is at the low voltage (while the control signal $XBD_{CLK}$ is at the high voltage), which turns on the switch unit $CM_{53}$, turns off the switch unit $CM_{54}$, and thus the shift register signal $SRO_3$ is served as the input signal $SRI_{22}$. As for the shift register $SR_3$, when the shift register signal $SRO_2$ is input, the control signal $VBD_{CLK}$ is at the low voltage (while the control signal $XBD_{CLK}$ is at the high voltage), which turns on the switch unit $CM_{61}$, turns off the switch unit $CM_{62}$, and thus the shift register signal $SRO_2$ is served as the input signal $SRI_{31}$; when the start signal ST is input, the control signal $XBD_{CLK}$ is at the low voltage (while the control signal $VBD_{CLK}$ is at the high voltage), which turns on the switch unit $CM_{63}$, turns off the switch unit $CM_{64}$, and thus the start signal ST is served as the input signal $SRI_{32}$. In this way, the transmission of the shift register signals in the forward direction is achieved by utilizing the phases of the clock signals CLK and XCLK. The operation of the transmission of the shift register signals in the reverse direction is similar and is omitted.

To sum up, the switch set of the bi-directional shift register circuit of the present invention utilizes clock signals as the control signals for the switches. Since the control signals of the switches do not always stay at same voltages in one direction, the aging problem of the switches is solved and therefore the lifespan of the switches increases.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A switch set for use in a bi-directional shift register module, the shift register module comprising a first shift register, a second shift register, and a third shift register, the second shift register coupled to the first shift register, the third shift register coupled to the second shift register, the shift register module sequentially transmitting shift register signals according to a first clock signal and an inversed clock signal of the first clock signal, the switch set comprising:
   a first switch device, comprising:
      a first control end for receiving a second clock signal;
      a second control end for receiving an inversed clock signal of the second clock signal;
      a third control end for receiving the second clock signal;
      a first input end for receiving a start signal;
      a second input end coupled to an output end of the second shift register;
      a first output end coupled to an input end of the first shift register for coupling the first input end of the first switch device to the input end of the first shift register when the second clock signal is at a first predetermined voltage; and
      a second output end coupled to the input end of the first shift register for coupling the second input end of the first switch device to the input end of the first shift register when the inversed clock signal of the second clock signal is at the first predetermined voltage; and
   a second switch device, comprising:
      a first control end for receiving the inversed clock signal of the second clock signal;
      a second control end for receiving the second clock signal;
      a third control end for receiving the inversed clock signal of the second clock signal;
      a first input end coupled to the output end of the first shift register;
      a second input end coupled to an output end of the third shift register;
      a first output end coupled to an input end of the second shift register for coupling the first input end of the second switch device to the input end of the second shift register when the inversed clock signal of the second clock signal is at the first predetermined voltage; and
      a second output end coupled to the input end of the second shift register for coupling the second input end of the second switch device to the input end of the second shift register when the second clock signal is at the first predetermined voltage.

2. The switch set of claim 1, wherein the first switch device comprises:
   a first switch unit comprising:
      a first switch comprising:
         a first end coupled to the first input end of the first switch device;
         a control end coupled to the first control end of the first switch device; and
         a second end coupled to the first output end of the first switch device for coupling to the first end of the first switch when the second clock signal is at the first predetermined voltage; and
      a second switch comprising:
         a first end coupled to the first input end of the first switch device;
         a control end coupled to the second control end of the first switch device; and
         a second end coupled to the first output end of the first switch device for coupling to the first end of the second switch when the inversed clock signal of the second clock signal is at the first predetermined voltage; and
   a second switch unit comprising:
      a third switch comprising:
         a first end coupled to the second input end of the first switch device;
         a control end coupled to the second control end of the first switch device; and
         a second end coupled to the second output end of the first switch device for coupling to the first end of the third switch when the third clock signal is at the first predetermined voltage; and
      a fourth switch comprising:
         a first end coupled to the second input end of the first switch device;
         a control end coupled to the third control end of the first switch device; and
         a second end coupled to the second output end of the first switch device for coupling to the first end of the fourth switch when the second clock signal is at the first predetermined voltage.

3. The switch set of claim 2, wherein the first and the third switches are PMOS, and the second and the fourth switches are NMOS.

4. The switch set of claim 1, wherein when the shift register module is set to transmit in a first direction, first clock input ends of the first, second, and the third shift registers receive the first clock signal, and second clock input ends of the first, second, and the third shift registers receive an inversed clock signal of the first clock signal; when the shift register module is set to transmit in a reverse direction of the first direction, first clock input ends of the first, second, and the third shift registers receive the inversed clock signal of the first clock signal, and second clock input ends of the first, second, and the third shift registers receives the first clock signal.

5. The switch set of claim 1, wherein frequencies of the first and the second clock signals are the same.

6. The switch set of claim 1, wherein phases of the first and the second clock signals are different.

7. The switch set of claim 4, wherein phases of the first and the second clock signals are the same.

8. The switch set of claim 1, wherein duty cycle ratio of the second clock signal is adjustable.

* * * * *